United States Patent [19]

Trabucco

[11] Patent Number: 5,761,048

[45] Date of Patent: Jun. 2, 1998

[54] CONDUCTIVE POLYMER BALL ATTACHMENT FOR GRID ARRAY SEMICONDUCTOR PACKAGES

[75] Inventor: Robert T. Trabucco, Los Altos, Calif.

[73] Assignee: LSI Logic Corp., Milpitas, Calif.

[21] Appl. No.: 632,952

[22] Filed: Apr. 16, 1996

[51] Int. Cl.$^6$ .................................................. H05K 1/14
[52] U.S. Cl. .................. 361/760; 361/767; 361/748; 361/757; 361/803; 257/787; 257/687; 257/737; 174/52.1; 174/52.2; 439/91; 439/591
[58] Field of Search .................. 361/760, 761, 361/764, 767, 748, 757, 803; 174/52.1, 52.2, 52.4; 257/787, 687, 692, 697; 439/91, 591

[56] References Cited

U.S. PATENT DOCUMENTS

| | | |
|---|---|---|
| 5,541,450 | 7/1996 | Jones et al. .................. 257/697 |
| 5,641,996 | 6/1997 | Omoya et al. .................. 257/787 |
| 5,666,270 | 9/1997 | Matsuda et al. .................. 361/704 |

*Primary Examiner*—Leo P. Picard
*Assistant Examiner*—David Foster
*Attorney, Agent, or Firm*—Fitch, Even, Tabin & Flannery

[57] ABSTRACT

According to the present invention, a method is provided for attaching a package substrate to a circuit board. In one version of the invention, the package substrate has a semiconductor die disposed thereon, and the semiconductor die has a plurality of bond pads formed thereon which are electrically connected to conductive traces on the package substrate. In one embodiment of the invention, the method comprises the steps of attaching a first surface of an electrical connector to one of the conductive traces by thermoplastic adhesion; and attaching a second surface of the electrical connector to a conducting pad on the circuit board, also by thermoplastic adhesion.

17 Claims, 1 Drawing Sheet

CONDUCTIVE POLYMER BALL ATTACHMENT FOR GRID ARRAY SEMICONDUCTOR PACKAGES

TECHNICAL FIELD

This invention relates generally to the field of semiconductor packaging and, more particularly, to ball grid array packaging technology.

BACKGROUND

Numerous types of semiconductor packaging are currently used throughout the industry. Examples include dual in-line packaging ("DIP"), pin grid array ("PGA's"), and surface mount types such as small outline integrated circuits ("SOIC's") and PQFP's. Still another type of surface mount packaging technology is known as ball grid array ("BGA") packaging. BGA packaging is being increasingly used throughout the industry, especially in medium or high lead count high performance applications.

This type of packaging typically employs a package substrate made from, for example, laminated PC board, or ceramic material, on which the semiconductor device is attached. The bond pads on the semiconductor device are electrically connected to conductive traces on the package substrate through conventional techniques such as wire bonding, TAB bonding or flip chip. The substrate package is then attached to a system circuit board through an electrical connection between the conductive traces on the package substrate and corresponding conductive traces on the system circuit board.

Typically, electrical connections for current BGA packages in the semiconductor industry consist of solder balls or columns made from solder alloys of various melting temperatures. These balls or columns are attached to the package and to the circuit board by either melting the balls/columns themselves, or by the addition of solder paste of the same or a different alloy or melting temperature. Although this system of package mounting has been widely accepted, it presents several disadvantages.

First, most of these alloys require temperatures in the range of 180°-230° C. to accomplish the attachment. These soldering temperatures can cause both package and circuit board to warp, creating mechanical stress after cooling down to room temperature in addition to deforming the solder balls.

Second, most of these soldering operations require the inclusion of a flux to optimize the solder flow on the surfaces. This flux normally requires an exacting cleaning operation after soldering which may still leave some residue on the system circuit board. Moreover, even if a "no clean" flux is used, the remaining "inert" residue is still undesirably left on the circuit board. Of course, there are some processes under development that use no flux at all, but these are mainly directed at mounting the balls or columns onto the packages, not to the circuit boards of the final system.

Third, soldering methods require the semiconductor device to be exposed to two or more reflow soldering cycles, one to attach the ball or column to the package and again to attach the package to a circuit board. Additional cycles are needed for double-sided assemblies and rework. This increases the vulnerability of PCB laminated types of packages to "popcorning" or delamination during soldering, caused by moisture absorbed by the package when exposed to air.

Fourth, in some single alloy ball/column configurations, it is difficult to maintain the desired underpackage spacing when the package-weight-to-ball-count ratio exceeds the ability of the molten solder balls to support the weight of the package. This can cause short circuits between contacts as they are mechanically deformed and "squish" outwardly from the contact.

Finally, the rework or replacement of defective packages is a difficult undertaking with conventional BGA packages, requiring more exposure of the package and system circuit board to soldering temperature, at least in a localized area, and the use of specialized equipment. This is because several steps are required at solder melting temperature: removal of defective package, cleaning of contact pads, and remounting of replacement device.

Therefore, it is an objective of the invention to overcome these and other difficulties, as well as to provide further improvements over the art as will become apparent in view of the following disclosure.

SUMMARY OF THE INVENTION

According to the present invention, a method is provided for attaching a package substrate to a circuit board. In one version of the invention, the package substrate has a semiconductor die disposed thereon, and the semiconductor die includes a plurality of bond pads thereon which are electrically connected to conductive traces on the package substrate, and the method comprises the steps of attaching a first surface of an electrical connector to one of the conductive traces by thermoplastic adhesion; and attaching a second surface of the electrical connector to a conducting pad on the circuit board, also by thermoplastic adhesion.

According to a further embodiment of the invention, there is provided a semiconductor package substrate having a semiconductor die disposed thereon, the semiconductor die including a plurality of bond pads which are electrically connected to a plurality of conductive traces disposed on the packaging substrate, at least one of the conductive die pads being adhesively connected to an electrical connector. In this embodiment, the electrical connector comprises a conducting member; and a thermoplastic conducting material covering the conducting member.

In still another embodiment of the invention, there is provided a substrate having a plurality of conductive traces disposed thereon, at least one of the conductive traces being adhesively connected to an electrical connector by a thermoplastic conducting material which substantially covers a conducting member.

BRIEF DESCRIPTION OF THE DRAWINGS

FIG. 3 is a cross-sectional view showing the attachment between a substrate and a system circuit board according to an embodiment of the

DETAILED DESCRIPTION OF EMBODIMENTS OF THE INVENTION

According to one embodiment of the invention, a method is provided for attaching a package substrate to a circuit board in a manner similar to current BGA packaging methods. However, rather than using a solder ball, or slug, an electronic connector is provided which comprises a metallic conducting member that has been coated with a conductive thermoplastic polymer material. In various embodiments of the invention, the metallic member is formed in different shapes. One convenient shape is that of a sphere and, for purposes of illustration, this is the shape that will be used to described the following embodiments of the invention. It will be understood, of course, that other suitable shapes will occur to those with skill in the art.

Figure 1:
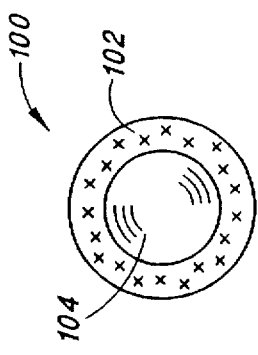
FIG. 1 is a cross-sectional view of an electrical conductor according to one embodiment of the invention.

Referring now to FIG. 1, there is shown a cross-section of an electronic connector according to an embodiment of the invention. Here, the electronic connector 100 comprises a metallic sphere 104 which is encapsulated by a thermoplastic material 102. The metallic sphere 100 is formed using conventional means from a good conductive material such as copper, gold, silver, etc. This sphere is coated with a thermoplastic material which is electrically conductive. For example, the material may be filled with an electrically conductive metallic flake such as silver or gold. The method used to coat the metallic sphere is not critical, and different suitable coating methods will occur to those with skill in the art. For example, in one method, the metallic sphere 100 is coated by using a heated fluidized bed, or various other heated coating processes commonly used for granular materials. Alternately, the sphere 100 may be forced through a thin film of a thermoplastic material such that a portion of the thermoplastic material adheres to the outer surface of the metallic sphere 104 to form the coating 102.

The exact thermoplastic material used is not critical, but in general it will have the properties of being electrically conductive, having a comparatively low melting point, sufficient adhesive strength, and being chemically inert with respect to the package substrate and circuit board. Therefore, different suitable thermoplastic materials will occur to those with skill in the art. For example, one thermoplastic material known to be useful with the present invention is polyetheretherketone ("PEEK"), and various derivatives thereof, which in some embodiments is filled with a conducting material such as silver flake. Other useful thermoplastic resins vary widely in polymer lengths and chemistries, offering a wide choice of properties which are selected to provide the best match with the substrate materials and mounting processes used in a particular application. Formulations of polysiloxancimide are also useful in other embodiments of the invention.

The coating on the metallic sphere 104 is ideally uniform and has a thickness of between about 0.03 and about 0.11 mm. Of course, it is to be understood that other applications will require different thicknesses, and it is within the abilities of one skilled in the art to select an appropriate coating thickness to match a particular application.

Mounting the electronic connectors onto a package substrate is performed in a process similar to ones currently used for solder ball mounting. For example, in one technique, the polymer-coated balls are bulk fed from a reservoir to a vacuum pick-up head or plate with the desired package pattern. Since a thermoplastic material melts when heated, the pattern of balls held by vacuum in the transfer head is moved and placed down onto a heated package substrate. The package need only be heated to, for example, 150°–175° C. depending on the melt temperature of the thermoplastic. By contrast, most solders require heating temperatures of at least 180° C. and typically about 210° C. to 220° C. A slight pressure is applied to the melting side of the ball, and the vacuum can be released leaving the ball attached on the substrate. The package substrate is then cooled down to solidify the thermoplastic and set the electrical connector in position.

Figure 2:
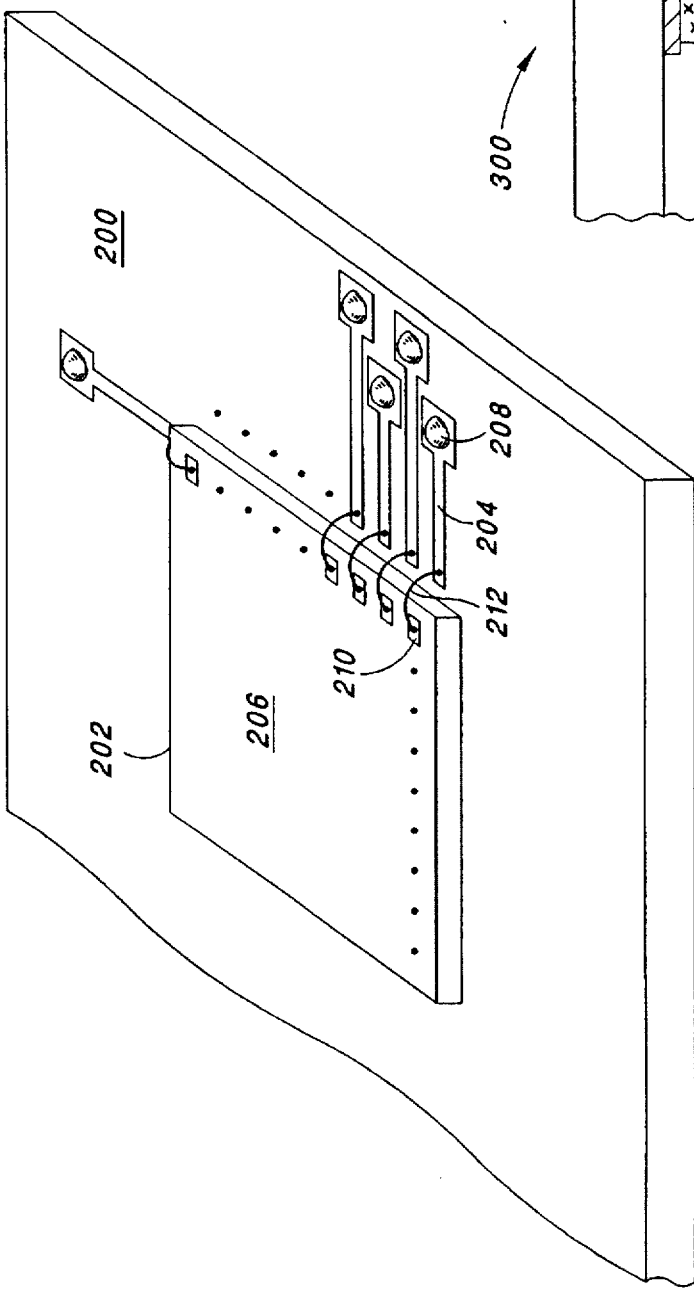
FIG. 2 illustrates a package substrate according to an embodiment of the invention.

FIG. 2 is a simplified view of an example package substrate 200 according to an embodiment of the invention. The embodiment shown is known as a "cavity down" BGA package in which a semiconductor die 206 is placed on the surface 202, or alternately in a cavity on surface 202, of the package substrate 200. The semiconductor die 206 has a plurality of bond pads 210 formed thereon. The bond pads 210, of course, provide electrical communication between the circuits of the semiconductor die 206 and the external circuitry of the circuit board (not shown). The bond pads 210 are connected to conductive traces 204 formed on the package substrate 200 by bond wire 212. It will be appreciated by those with skill in the art that wire bonding the bond pads 210 to conductive traces 204 is only one way of connecting the bond pads 210 to the traces 204. Other suitable methods for connecting bond pads 210 to traces 204 include tape automated bonding ("TAB") and flip-chip techniques.

As shown, electrical connector 208 is attached to conductive trace 204 by the thermoplastic adhesion between the coating on the metallic member of connector 208 and the conductive trace 204. Later, when the package substrate 200 is attached to the circuit board (not shown), electrical connector 208 will provide a portion of the circuit path connecting conductive pads on the circuit board and bond pads 210 of the semiconductor die 206.

Attaching the package substrate to a system circuit board follows a similar process. The package is placed on the circuit board, the board is heated to the melt temperature of the thermoplastic material, allowed to stabilize, and cooled down. The circuit board can be locally heated according to known techniques, such as hot gas or IR heat sources.

Of course, those skilled in the art will recognize that the present invention is not limited to packaging substrates as shown in FIG. 2, and in other embodiments, a wide variety of substrates are joined. For example, in one version of the invention, the invention is used to join two substrates, each comprising a PCB circuit board having conductive traces formed thereon. The PCB circuit boards may have any number of electronic components, such as resistors, capacitors, semiconductors, etc., mounted to them.

In a further embodiment, the invention is used to join together substrates of different material types. For example, a glass substrate, such as those used for liquid crystal displays ("LCD's") having conductive traces disposed thereon, may be joined to a PCB circuit board in accordance with the present invention. Still other examples of suitable substrates include ceramics and semiconductor chips in which the bond pads of the chip are connected to conductive traces of the substrate in a manner similar to that used in flip chip technology, except that the raised bond pads employed in flip chips are replaced by electrical connectors according to the present invention. Aspects of the invention in which two substrates are joined are described in greater detail with respect to FIG. 3.

Figure 3:
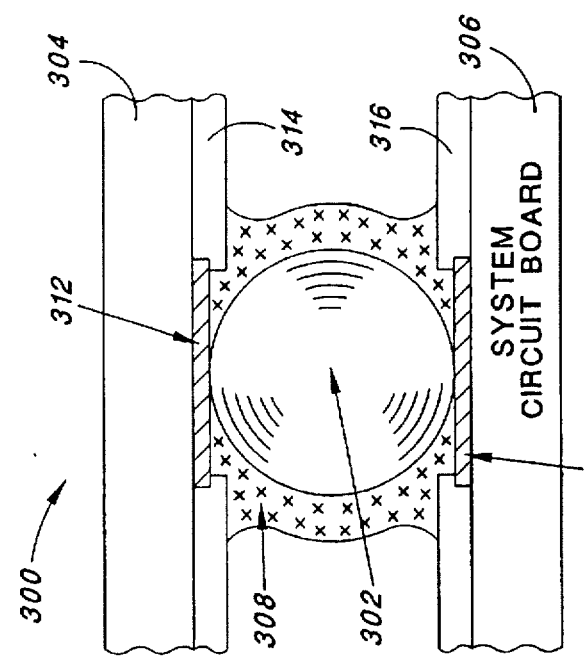

FIG. 3 shows a cross-sectional view of an electrical connector 302 connecting one substrate 304 to another substrate, in this example, a system circuit board 306. As shown, the spherical conducting member of electrical connector 302 provides an electrical connection between the conductive trace 312 of substrate 304 and conductive pad 310 of the circuit board 306. The thermoplastic material 308 not only provides additional conductive material between trace 312 and conductive pad 310, but it also provides the adhesive strength to hold the substrate 304 in position relative to the circuit board 306. The desired contact area of the conductive pad 310 and conductive trace 312 is defined by the insulative material layers 316 and 314 respectively. As is clear from the figure, there is no risk from short circuits due to heavy, high lead count ceramics or packages with heat sinks, because connector 302, being solid, will not deform due to these pressures. Moreover, the thermoplastic material 308 requires no "flux" to clean the surface prior to the adhesion and will not leave any residue on the circuit board 306.

Additionally, the thermoplastic conductor 305, being a flexible material, will maintain adhesion strength as the whole system is exposed to the expansion and contraction difference of the two substrate materials 304 and 306.

The above-described embodiments of the invention are for purposes of illustration, and are not to be considered limiting because the invention may admit to other equally effective embodiments which will occur to those with skill in the art without departing from the scope and spirit of the present invention.

What is claimed is:

1. A method for attaching a package substrate to a circuit board, the package substrate having a semiconductor die disposed thereon, the semiconductor die including a plurality of bond pads which are electrically connected to conductive traces on the package substrate, the method comprising:

attaching a first surface of an electrical connector, said electrical connector comprising a metallic conductive member substantially covered by a thermoplastic conductive material, to one of the conductive traces on the package substrate by thermoplastic adhesion; and attaching a second surface of the electrical connector to a conducting pad on the circuit board by thermoplastic adhesion.

2. A method as in claim 1 wherein attaching a first surface comprises heating the electrical connector such that a thermoplastic material bonds to the package substrate.

3. A method as in claim 1 wherein attaching a second surface comprises heating the electrical connector such that a thermoplastic material bonds to the circuit board.

4. A method as in claim 2 wherein the thermoplastic material comprises a member selected from the group consisting of polyetheretherketone, polysiloxanemide, and derivatives thereof.

5. A semiconductor package substrate having a semiconductor die disposed thereon, the semiconductor die including a plurality of bond pads which are electrically connected to a plurality of conductive traces disposed on the package substrate, at least one of the conductive traces on the package substrate being adhesively connected to an electrical connector, the electrical connector comprising a metallic conductive member substantially covered by a thermoplastic conducting material, wherein a first surface of the electrical connector is connected to the package substrate and a second surface of the electrical connector is connected to the circuit board.

6. A semiconductor package substrate as in claim 5 wherein the conductive member is spherical in shape.

7. A semiconductor package substrate as in claim 5 wherein the thermoplastic conducting material comprises a member selected from the group consisting of polyetheretherketone, polysiloxanemide and derivatives thereof.

8. A semiconductor package substrate as in claim 5 wherein the conductive member comprises gold.

9. A semiconductor package substrate as in claim 5 wherein the conductive member comprises silver.

10. A semiconductor package substrate as in claim 5 wherein the conductive member comprises copper.

11. A substrate having a plurality of conductive traces disposed thereon, at least one of the conductive traces being adhesively connected to a metallic conducting member which is substantially covered by a thermo-plastic conducting material.

12. A substrate as in claim 11 wherein the conductive member is spherical in shape.

13. A substrate as in claim 11 wherein the thermoplastic conducting material comprises a member selected from the group consisting of polyetheretherketone, polysiloxanemide and derivatives thereof.

14. A substrate as in claim 11 wherein the conductive member comprises gold.

15. A substrate as in claim 11 wherein the conductive member comprises silver.

16. A substrate as in claim 11 wherein the conductive member comprises copper.

17. A method for attaching a package substrate to a circuit board as in claim 1, wherein said attaching a first surface of the electrical connector to a conductive trace and said attaching a second surface of the electrical connector to a conducting pad comprises heating the thermoplastic conductive material to a temperature of less than about 175° C.

* * * * *